(12) United States Patent
Du

(10) Patent No.: US 11,152,448 B2
(45) Date of Patent: Oct. 19, 2021

(54) ARRAY SUBSTRATE AND OLED DISPLAY DEVICE

(71) Applicant: TCL China Star Optoelectronics Technology Co., Ltd., Guangdong (CN)

(72) Inventor: Peng Du, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/616,462

(22) PCT Filed: Sep. 6, 2019

(86) PCT No.: PCT/CN2019/104608
§ 371 (c)(1),
(2) Date: Nov. 24, 2019

(87) PCT Pub. No.: WO2021/031245
PCT Pub. Date: Feb. 25, 2021

(65) Prior Publication Data
US 2021/0083032 A1 Mar. 18, 2021

(30) Foreign Application Priority Data
Aug. 21, 2019 (CN) .......................... 201910771653.2

(51) Int. Cl.
*H01L 27/32* (2006.01)
(52) U.S. Cl.
CPC ...... *H01L 27/3276* (2013.01); *H01L 27/3253* (2013.01); *H01L 27/3262* (2013.01)

(58) Field of Classification Search
CPC ............. H01L 27/3253; H01L 27/3262; H01L 27/3276; H01L 27/3297
USPC ....................................... 257/40, 88
See application file for complete search history.

(56) References Cited

U.S. PATENT DOCUMENTS

| 2013/0106817 A1* | 5/2013 | Gang | ...................... G02F 1/061 345/211 |
| 2014/0159609 A1 | 6/2014 | Xie | |
| 2016/0203761 A1* | 7/2016 | Zhang | .................. G09G 3/3233 345/690 |

(Continued)

FOREIGN PATENT DOCUMENTS

| CN | 103278984 A | 9/2013 |
| CN | 106353943 A | 1/2017 |

(Continued)

*Primary Examiner* — Matthew E Warren
(74) *Attorney, Agent, or Firm* — Hamre, Schumann, Mueller & Larson, P.C.

(57) ABSTRACT

The present disclosure provides an array substrate which comprises a plurality of sub-pixels distributed in an array arrangement, wherein data lines and power supply signal lines are disposed between two adjacent columns of the sub-pixels; wherein the data lines and the power supply signal lines are prepared respectively on different film layer surfaces, and the data lines and the power supply signal lines at least partially overlap. The present disclosure further provides an OLED display device which comprises the array substrate. The array substrate of the present disclosure has a higher aperture ratio.

18 Claims, 4 Drawing Sheets

(56) References Cited

U.S. PATENT DOCUMENTS

| | | | |
|---|---|---|---|
| 2017/0192562 A1 | 7/2017 | Zhou et al. | |
| 2017/0316730 A1* | 11/2017 | Cheng | H01L 27/124 |
| 2020/0035762 A1* | 1/2020 | Kim | G02F 1/1303 |
| 2020/0064702 A1* | 2/2020 | Yeh | H01L 27/3276 |
| 2020/0144298 A1* | 5/2020 | Tao | H01L 27/3244 |
| 2020/0194470 A1 | 6/2020 | Wang et al. | |
| 2020/0312942 A1* | 10/2020 | Yang | H01L 27/3276 |
| 2020/0328266 A1* | 10/2020 | Liu | H01L 51/56 |

FOREIGN PATENT DOCUMENTS

| | | |
|---|---|---|
| CN | 109449180 A | 3/2019 |
| CN | 109599031 A | 4/2019 |

\* cited by examiner

ARRAY SUBSTRATE AND OLED DISPLAY DEVICE

FIELD OF INVENTION

The present disclosure relates to the field of display technologies, and more particularly to an array substrate and an OLED display device.

BACKGROUND OF INVENTION

OLED panels have been gradually applied in the field of large-sized panels, especially in a bottom emission structure, which has a simple manufacturing process and costs that can be effectively controlled.

Compared with TFT-LCD pixels, OLED pixels are more complicated, and there are more non-light-emitting devices in the pixels, especially dense distributed vertical lines between sub-pixels, which occupy a great area that causes a lower pixel aperture ratio, thereby leading to low brightness and high power consumption of display devices, and not beneficial to product competitiveness.

Therefore, improving the aperture ratio of OLED pixels is an urgent problem to be solved in the industry.

Technical problem: compared with TFT-LCD pixels, OLED pixels are more complicated, non-light-emitting devices in pixels are more, especially dense distribution of vertical lines between sub-pixels, which occupying a great area that causes a lower pixel aperture ratio, thereby leading to low brightness and high power consumption of display devices, and not beneficial to product competitiveness.

SUMMARY OF INVENTION

To solve the above problem, the present disclosure provides an array substrate to solve the technical problem of dense vertical lines in current display devices that causes a lower pixel aperture ratio, thereby affecting brightness and power consumption of display devices.

To solve the above problem, the present disclosure provides following technical solutions:

An embodiment of the present disclosure provides an array substrate. The array substrate comprises a plurality of sub-pixels distributed in an array arrangement, wherein data lines and power supply signal lines are disposed between two adjacent columns of the sub-pixels; and compensation signal lines disposed in parallel with the power supply signal lines;

wherein the data lines and the power supply signal lines are on different film layer surfaces, and the data lines and the power supply signal lines at least partially overlap;

the data lines are disposed on the array substrate, the power supply signal lines are on a back side of the array substrate and disposed opposite to the data lines, a signal input terminal of the power supply signal lines extends to a bonding area and is electrically connected to a control chip by a through-hole disposed on the array substrate.

In an embodiment of the present disclosure, the data lines and the power supply signal lines have a same extension direction.

In an embodiment of the present disclosure, each sub-pixel of the array substrate comprises a first thin film transistor, a second thin film transistor, scanning lines, cathode signal lines, the data lines, the power supply signal lines, and a storage capacitor;

wherein a gate electrode of the first thin film transistor is electrically connected to the scanning lines, and a source electrode of the first thin film transistor is electrically connected to the data lines;

wherein a gate electrode of the second thin film transistor is electrically connected to a drain electrode of the first thin film transistor, a source electrode of the second thin film transistor is electrically connected to the power supply signal lines, and a drain electrode of the second thin film transistor is electrically connected to an anode of an OLED;

a cathode of the OLED is electrically connected to the cathode signal lines;

The storage capacitor is electrically connected to the gate electrode and the drain electrode of the second thin film transistor.

In an embodiment of the present disclosure, each column of the sub-pixels corresponds to one of the data lines and one of the power supply signal lines.

In an embodiment of the present disclosure, the compensation signal lines and the data lines at least partially overlap, and the compensation signal lines and the data lines have a same extension direction.

In an embodiment of the present disclosure, the compensation signal lines are on a back side of the array substrate and are alternatively disposed with the power supply signal lines.

In an embodiment of the present disclosure, one sub-pixel of the array substrate comprises a first thin film transistor, a second thin film transistor, a third thin film transistor, scanning lines, cathode signal lines, the data lines, the power supply signal lines, the compensation signal lines, and a storage capacitor; an adjacent sub-pixel thereof comprises a fourth thin film transistor, a fifth thin film transistor, a sixth thin film transistor, the scanning lines, the cathode signal lines, the data lines, the power supply signal lines, the compensation signal lines, and the storage capacitor;

wherein a gate electrode of the first thin film transistor is electrically connected to the scanning lines, and a source electrode of the first thin film transistor is electrically connected to an N-th level data line;

wherein a gate electrode of the second thin film transistor is electrically connected to a drain electrode, a source electrode of the second thin film transistor is electrically connected to an N-th level power supply signal line, and a drain electrode of the second thin film transistor is electrically connected to an anode of an OLED;

a cathode of the OLED is electrically connected to the cathode signal lines;

a gate electrode of the third thin film transistor is electrically connected to the scanning lines, a source electrode of the third thin film transistor is electrically connected to the compensation signal lines, and a drain electrode of the third thin film transistor is electrically connected to the drain electrode of the second thin film transistor;

a gate electrode of the fourth thin film transistor is electrically connected to the scanning lines, and a source electrode of the fourth thin film transistor is electrically connected to an (N+1)-th level data line;

a gate electrode of the fifth thin film transistor is electrically connected to a drain electrode of the fourth thin film transistor, a source electrode of the fifth thin film transistor is electrically connected to an (N+1)-th level power supply signal line, and a drain electrode of the fifth thin film transistor is electrically connected to the anode of the OLED;

a gate electrode of the sixth thin film transistor is electrically connected to the scanning lines, a source electrode of the sixth thin film transistor is electrically connected to the compensation signal lines, and a drain electrode of the sixth thin film transistor is electrically connected to the drain electrode of the fifth thin film transistor;

the storage capacitor is electrically connected to the gate electrode and the drain electrode of the second thin film transistor, or is electrically connected to the gate electrode and the drain electrode of the fifth thin film transistor;

the two adjacent sub-pixels share one of the compensation signal lines.

In an embodiment of the present disclosure, each column of the sub-pixels corresponds to one of the data lines, and every two columns of the sub-pixels correspond to one of the power supply signal lines or the compensation signal lines.

A second aspect of an embodiment of the present disclosure provides an array substrate. The array substrate comprises a plurality of sub-pixels distributed in an array arrangement, wherein data lines and power supply signal lines are disposed between two adjacent columns of the sub-pixels;

wherein the data lines and the power supply signal lines are on different film layer surfaces, and the data lines and the power supply signal lines at least partially overlap.

In an embodiment of the present disclosure, the data lines are disposed on the array substrate, the power supply signal lines are on a back side of the array substrate and disposed opposite to the data lines, a signal input terminal of the power supply signal lines extends to a bonding area and is electrically connected to a control chip by a through-hole disposed on the array substrate.

In an embodiment of the present disclosure, the data lines and the power supply signal lines have a same extension direction.

In an embodiment of the present disclosure, each sub-pixel of the array substrate comprises a first thin film transistor, a second thin film transistor, scanning lines, cathode signal lines, the data lines, the power supply signal lines, and a storage capacitor;

wherein a gate electrode of the first thin film transistor is electrically connected to the scanning lines, and a source electrode of the first thin film transistor is electrically connected to the data lines;

a gate electrode of the second thin film transistor is electrically connected to a drain electrode of the first thin film transistor, a source electrode of the second thin film transistor is electrically connected to the power supply signal lines, and a drain electrode of the second thin film transistor is electrically connected to an anode of an OLED;

a cathode of the OLED is electrically connected to the cathode signal lines;

The storage capacitor is electrically connected to the gate electrode and the drain electrode of the second thin film transistor.

In an embodiment of the present disclosure, each column of the sub-pixels corresponds to one of the data lines and one of the power supply signal lines.

In an embodiment of the present disclosure, the array substrate further comprising compensation signal lines disposed in parallel with the power supply signal lines, the compensation signal lines and the data lines at least partially overlap, and the compensation signal lines and the data lines have a same extension direction.

In an embodiment of the present disclosure, the compensation signal lines are on a back side of the array substrate and are alternatively disposed with the power supply signal lines.

In an embodiment of the present disclosure, one sub-pixel of the array substrate comprises a first thin film transistor, a second thin film transistor, a third thin film transistor, scanning lines, cathode signal lines, the data lines, the power supply signal lines, the compensation signal lines, and a storage capacitor; an adjacent sub-pixel thereof comprises a fourth thin film transistor, a fifth thin film transistor, a sixth thin film transistor, the scanning lines, the cathode signal lines, the data lines, the power supply signal lines, the compensation signal lines, and the storage capacitor;

wherein a gate electrode of the first thin film transistor is electrically connected to the scanning lines, and a source electrode of the first thin film transistor is electrically connected to an N-th level data line;

wherein a gate electrode of the second thin film transistor is electrically connected to a drain electrode, a source electrode of the second thin film transistor is electrically connected to an N-th level power supply signal line, and a drain electrode of the second thin film transistor is electrically connected to an anode of an OLED;

a cathode of the OLED is electrically connected to the cathode signal lines;

a gate electrode of the third thin film transistor is electrically connected to the scanning lines, a source electrode of the third thin film transistor is electrically connected to the compensation signal lines, and a drain electrode of the third thin film transistor is electrically connected to the drain electrode of the second thin film transistor;

a gate electrode of the fourth thin film transistor is electrically connected to the scanning lines, and a source electrode of the fourth thin film transistor is electrically connected to an (N+1)-th level data line;

a gate electrode of the fifth thin film transistor is electrically connected to a drain electrode of the fourth thin film transistor, a source electrode of the fifth thin film transistor is electrically connected to an (N+1)-th level power supply signal line, and a drain electrode of the fifth thin film transistor is electrically connected to the anode of the OLED;

a gate electrode of the sixth thin film transistor is electrically connected to the scanning lines, a source electrode of the sixth thin film transistor is electrically connected to the compensation signal lines, and a drain electrode of the sixth thin film transistor is electrically connected to the drain electrode of the fifth thin film transistor;

the storage capacitor is electrically connected to the gate electrode and the drain electrode of the second thin film transistor, or is electrically connected to the gate electrode and the drain electrode of the fifth thin film transistor;

the two adjacent sub-pixels share one of the compensation signal lines.

In an embodiment of the present disclosure, each column of the sub-pixels corresponds to one of the data lines, and every two columns of the sub-pixels correspond to one of the power supply signal lines or the compensation signal lines.

a third aspect of an embodiment of the present disclosure further provides an OLED display device which comprises an array substrate, wherein the array substrate comprises a plurality of sub-pixels distributed in an array arrangement, wherein data lines and power supply signal lines are disposed between two adjacent columns of the sub-pixels;

wherein the data lines and the power supply signal lines are on different film layer surfaces, and the data lines and the power supply signal lines at least partially overlap.

In an embodiment of the present disclosure, the data lines are disposed on the array substrate, the power supply signal lines are on a back side of the array substrate and disposed opposite to the data lines, a signal input terminal of the power supply signal lines extends to a bonding area and is electrically connected to a control chip by a through-hole disposed on the array substrate.

In an embodiment of the present disclosure, the data lines and the power supply signal lines have a same extension direction.

The beneficial effect of the present disclosure is that: compared to current array substrates and OLED display devices, the array substrate and OLED display device provided in the present disclosure solve the technical problem of dense vertical lines in current array substrates that causes a lower pixel aperture ratio, thereby affecting brightness and power consumption of display devices. The technical problem is solved by preparing data lines and power supply signal lines respectively on different film layer surfaces in the vertical direction, and the data lines and the power supply signal lines at least partially overlap that makes each column of sub-pixels correspond to one of the data lines and one of the power supply signal lines. In this way, area occupied by circuit lines in the vertical direction of pixels is become less, thereby improving aperture ratio of pixels.

DETAILED DESCRIPTION OF PREFERRED EMBODIMENTS

The specific embodiments described with reference to the attached drawings are all exemplary and are intended to illustrate and interpret the present disclosure.

Figure 1:
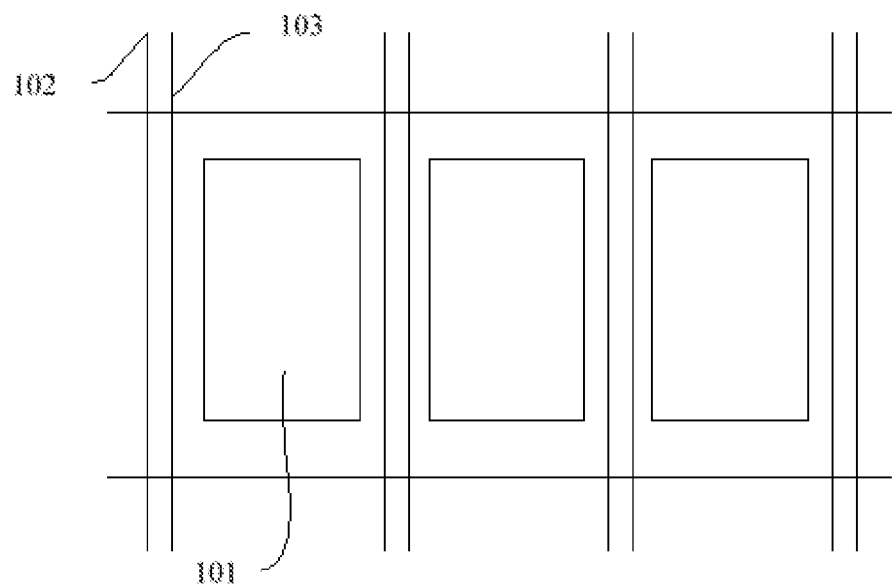
FIG. 1 is a schematic structural diagram of pixels in current array substrates.

OLED pixel structures are more complicated. FIG. 1 is a schematic structural diagram of pixels in current array substrates. As shown in FIG. 1, a plurality of sub-pixels 101 are distributed in the pixel. A plurality of data lines 102 and power supply signal lines 103 are disposed among the sub-pixels 101. There are greater numbers of data lines 102 and power supply signal lines 103 and they occupy a great area in the pixel that causes aperture ratio of current OLED pixels not to be high, thereby making OLED display devices have low brightness and high power consumption.

Regarding current array substrates and OLED display devices, an embodiment of the present disclosure can solve the technical problem of dense lines in the vertical direction occupying a great area that causes a lower pixel aperture ratio, thereby making display devices have low brightness and high power consumption.

FIG. 2A to 2D is schematic diagrams of an array substrate according to embodiment 1 of the present disclosure. An array substrate provided by embodiment 1 of the present disclosure comprises a plurality of sub-pixels 201 distributed in an array arrangement, data lines 202 and power supply signal lines 203 are disposed between two adjacent columns of sub-pixels 201. Wherein the data lines 202 and the power supply signal lines 203 are prepared on different film layer surfaces, and the data lines 202 and the power supply signal lines 203 at least partially overlap.

Figure 2A:
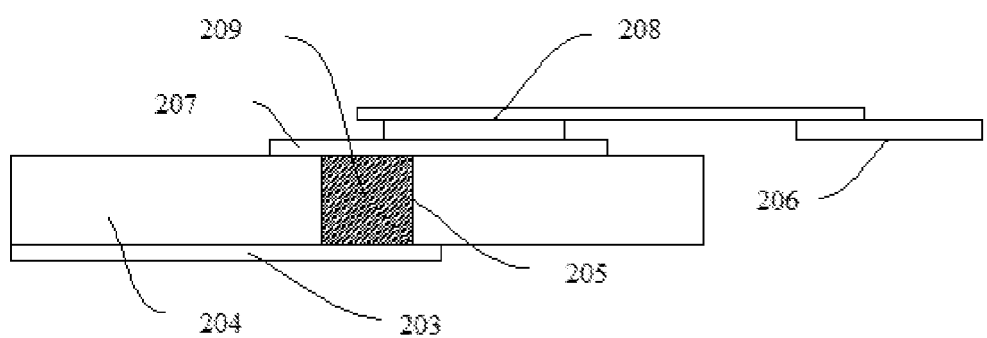
FIG. 2A is a partial schematic structural diagram of an array substrate according to embodiment 1 of the present disclosure.

As shown in FIG. 2A, the data lines 202 is disposed on the array substrate, the power supply signal lines 203 is prepared on a back side of the array substrate (that is on the back side of a glass substrate 204 in the embodiment) and disposed opposite to the data lines 202, a signal input terminal of the power supply signal lines 203 extends to a bonding area and is electrically connected to a control chip 206 by a through-hole 205 disposed on the array substrate.

Wherein the bonding area includes a pad 207 disposed on one side surface of the glass substrate 204 and covering one side opening of the through-hole 205, and a conductive film layer 208 spread on a surface of the pad 207. The power supply signal lines 203 is connected to the through-hole 205, the pad 207, and the conductive film layer 208 and conducted.

The through-hole 205 is provided with a conductor 209, and the conductor 209 can be an iron rod, a copper block, or any other electrically conductive substances.

The conductive film layer 208 is consist of two layers of conductive pastes. The conductive film layer 208 can attach to and conduct the pad 207 and the control chip 206 at the other end of the conductive film layer 208, making the control chip 206 drive the array substrate.

In the embodiment, the power supply signal lines 203 is prepared on a surface of one side of the glass substrate 204, and connected to another power supply signal line 203 (not shown in FIG. 2A) at another end of the pad 207. The power supply signal lines 203 are connected and conducted through the through-hole 205, the conductor 209 therein, the pad 207, and the conductive film layer 208. Therefore, both sides of the glass substrate 204 are conducted.

Figure 2B:
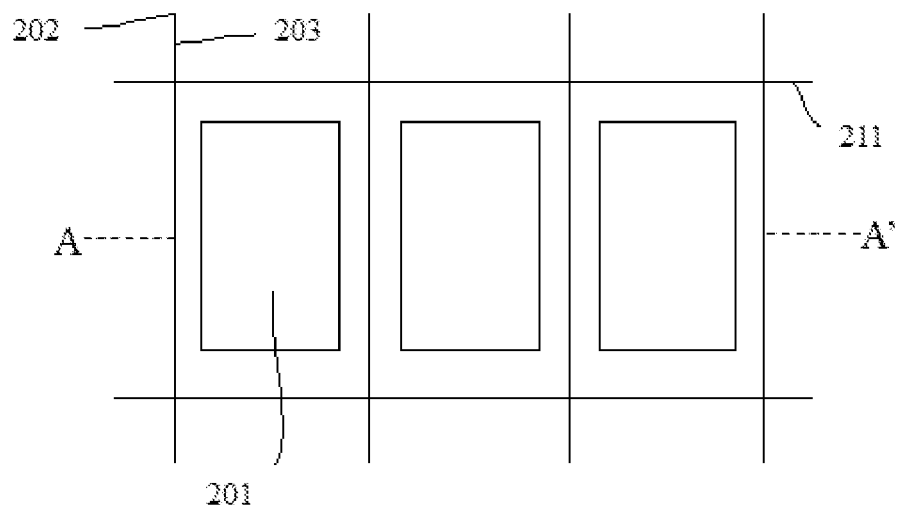
FIG. 2B is a schematic structural diagram of pixels of an array substrate according to embodiment 1 of the present disclosure.

As shown in FIG. 2B, the pixel structure of the array substrate according to embodiment 1 of the present disclosure is that each column of the sub-pixels 201 corresponds to one of the data lines 202 and one of the power supply signal lines 203, and the data lines 202 and the power supply signal lines 203 at least partially overlap. In this way, area occupied by vertical lines in the pixel structure is reduced. It can be known from FIG. 2B and FIG. 1, the reduced area between the power supply signal lines 203 and the data lines 202 of the pixel structure in the embodiment makes aperture ratio of the pixel increase.

The sub-pixels in the embodiment is R, G, or B, but it is not limited the three kinds of the sub-pixels 201 in other embodiments, and the arrangement of the sub-pixels 201 is not limited.

Figure 2C:
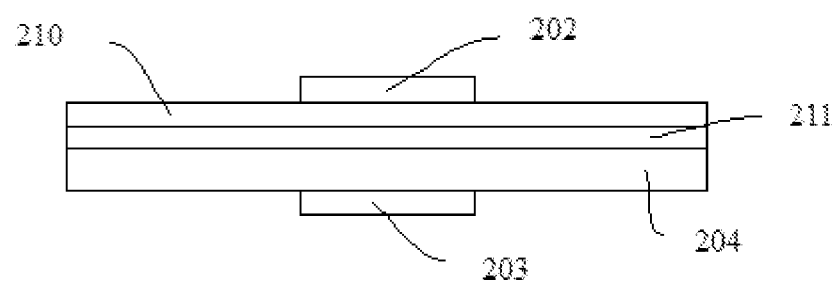
FIG. 2C is a schematic cross-sectional structural diagram of area A-A' in FIG. 2B.

FIG. 2C is a schematic cross-sectional structural diagram of area A-A' in FIG. 2B. In the figure, from the top to the bottom are respectively the data lines 202, a gate insulating layer 210, scanning lines 211, the glass substrate 204, and the power supply signal lines 203. Wherein the data lines 202 are prepared on a surface of the gate insulating layer 210. In other embodiment, the data lines 202 can be prepared on other film layer in parallel with the glass substrate 204. The data lines 202 are prepared on a surface of the film layer along an extension direction of the film layer, and the power supply signal lines 203 are prepared along an extension direction of the array substrate. That is, the power supply signal lines 203 and the data lines 202 have the same extension direction.

Because a thickness of the glass substrate 204 is greater, about 0.5 mm, and thicknesses of insulation layers, such as the gate insulating layer 210 and a flat layer (not shown in the figure), are less than the thickness of the glass substrate 204 and conventionally, are microns. Therefore, the parasitic capacitance between the power supply signal lines 203 and the data lines 202 is very small, and the mutual coupling between the two can be ignored.

Figure 2D:
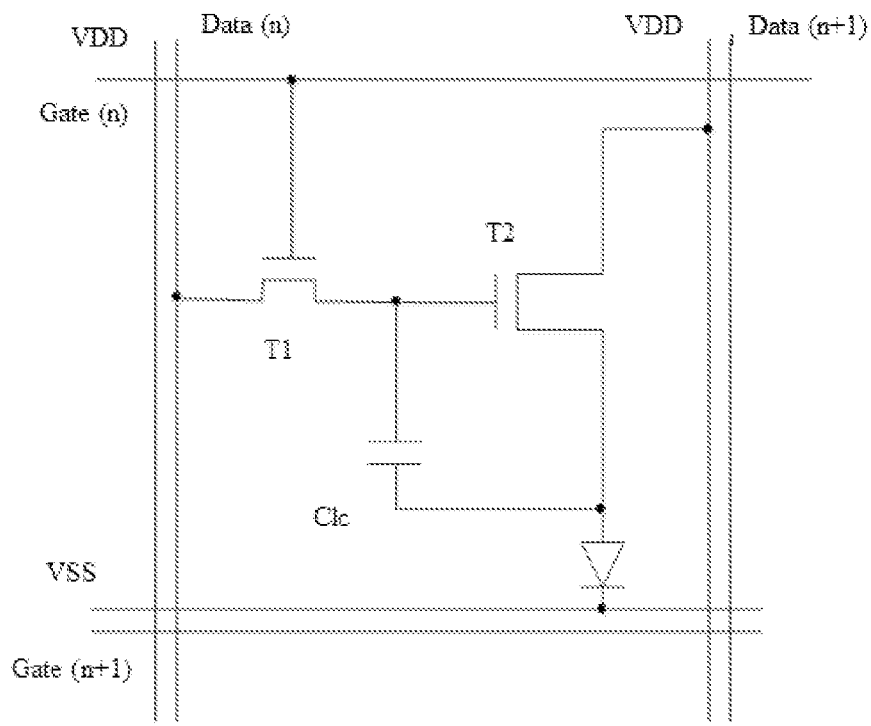
FIG. 2D is a pixel equivalent circuit diagram of an array substrate according to embodiment 1 of the present disclosure.

FIG. 2D is a pixel equivalent circuit diagram of an array substrate according to embodiment 1 of the present disclosure. The pixel structure of 2T1C is used in the embodiment. That is, each sub-pixel 201 of the array substrate comprises a first thin film transistor T1, a second thin film transistor T2, scanning lines Gate, cathode signal lines VSS, data lines Data, power supply signal lines VDD, and a storage capacitor Clc. Wherein a gate electrode of the first thin film transistor T1 is electrically connected to the scanning lines Gate, and a source electrode of the first thin film transistor is electrically connected to the data lines Data; a gate electrode of the second thin film transistor T2 is electrically connected to a drain electrode of the first thin film transistor T1, a source electrode of the second thin film transistor T2 is electrically connected to the power supply signal lines VDD, and a drain electrode of the second thin film transistor T2 is electrically connected to an anode of an OLED; a cathode of the OLED is electrically connected to the cathode signal lines VSS; the storage capacitor Clc is electrically connected to the gate electrode and the drain electrode of the second thin film transistor T2.

The pixel in the embodiment is consisting of two thin film transistors, a storage capacitor, and OLED devices, wherein a role of the power supply signal lines VDD are to supply power to OLED devices, and the data lines Data are responsible for transmitting data signals of images.

Embodiment 1 of the present disclosure is to prepare the data lines 202 and the power supply signal lines 203 respectively on both sides of the glass substrate 204, the power supply signal lines 203 are prepared on a surface of one side of the glass substrate 204, and the data lines 202 are prepared on a surface of the gate insulating layer 210. In other embodiments, the data lines 202 and the power supply signal lines 203 can be prepared on surfaces of any two different film layers, as long as the power supply signal lines 203 and the data lines 202 extend in a same direction, and the data lines 202 and the power supply signal lines 203 at least partially overlap in the pixel structure.

Embodiment 1 of the present disclosure can improve aperture ratio of the pixels by reducing areas between the data lines 202 and the power supply signal lines 203 and making both at least partially overlap.

Figure 3A:
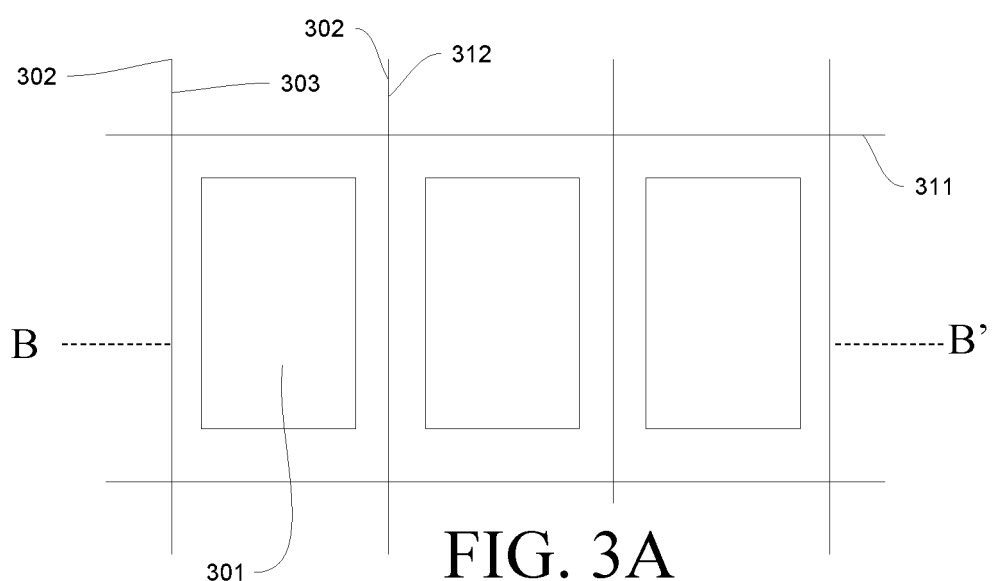
FIG. 3A is a schematic structural diagram of pixels of an array substrate according to embodiment 2 of the present disclosure.
Figure 3B:
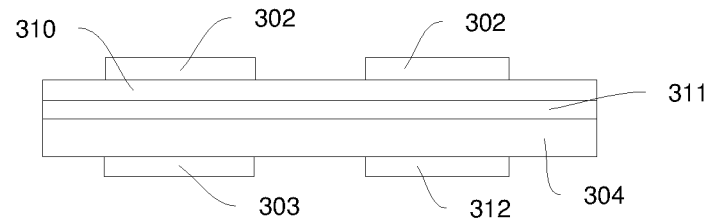
FIG. 3B is a schematic cross-sectional structural diagram of area B-B' in FIG. 3A.
Figure 3C:
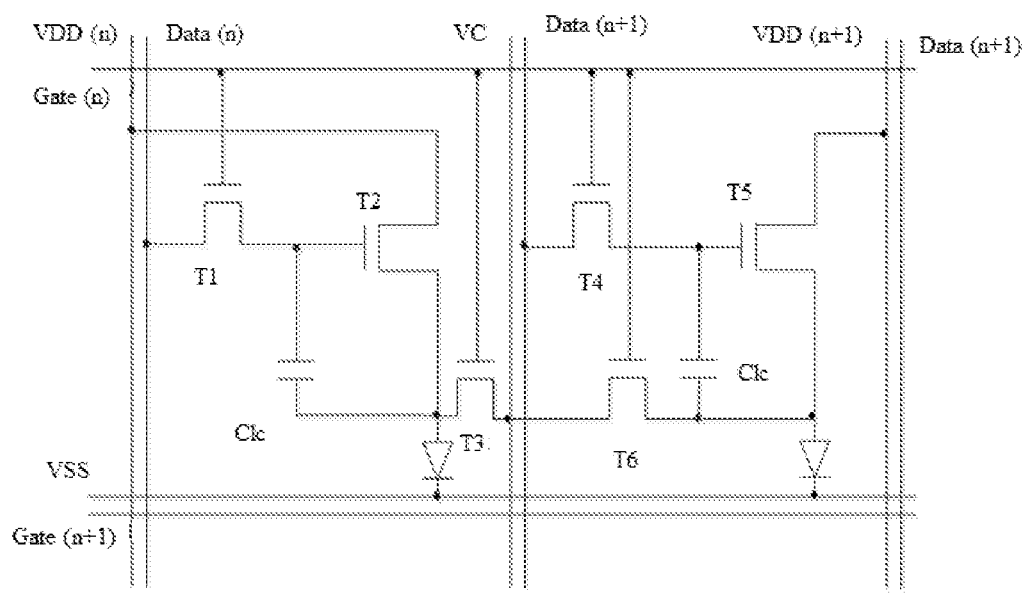
FIG. 3C is a pixel equivalent circuit diagram of an array substrate according to embodiment 2 of the present disclosure.

FIG. 3A to 3C are schematic diagrams of an array substrate according to embodiment 2 of the present disclosure. The array substrate provided in embodiment 2 of the present disclosure comprises: a plurality of sub-pixels 301 distributed in an array arrangement, data lines 302, power supply signal lines 303, and compensation signal lines 312 are disposed between two adjacent columns of sub-pixels 301. Wherein the data lines 302, the power supply signal lines 303, and the compensation signal lines 312 are prepared on different film layer surfaces, the data lines 302 and the power supply signal lines 303 at least partially overlap, the compensation signal lines 312 and the data lines 302 at least partially overlap, the data lines 302 and the power supply signal lines 303 have a same extension direction, and the compensation signal line 312 and the data lines 302 have the same extension direction.

A signal input terminal of the compensation signal lines 312 extends to a bonding area and is electrically connected to a control chip by a through-hole disposed on the array substrate.

The compensation signal lines 312 and the power supply signal lines 303 are prepared on a surface of a same film layer. In the embodiment, the compensation signal lines 312 and the power supply signal lines 303 are prepared on the back side of the glass substrate 304, the compensation signal lines 312 and the power supply signal lines 303 are alternatively distributed on the surface of the film layer, and respectively correspond to the data lines 302 on another film layer surface.

As shown in FIG. 3A, the sub-pixels 301 on each column correspond to one of the data lines 302, and the sub-pixels 301 on every two columns correspond to one of the power supply signal lines 303 or one of the compensation signal lines 312. That is, in the vertical direction of the pixel structure, the power supply signal lines 303 and the compensation signal lines 312 are alternately distributed along the sub-pixels 301 of each column. Compared to embodiment 1, the compensation signal lines 312 are added in the embodiment. In addition to improve aperture ratio of the pixels by at least partial overlap of the power supply signal lines 303 and the data lines 302, the compensation signal lines 312 and the data lines 302 also at least partially overlap to decrease areas between the compensation signal lines 312 and the data lines 302 that further improves aperture ratio of the pixels.

The sub-pixels in the embodiment is R, G, or B, but it is not limited the three kinds of the sub-pixels 301 in other embodiments, and the arrangement of the sub-pixels 301 is not limited.

FIG. 3B is a schematic cross-sectional structural diagram of area B-B' in FIG. 3A. It can be known from the figure, the compensation signal lines 312 and the power supply signal lines 303 are located on a same side surface of the glass substrate 304, the data lines 302 are located on the other side of the glass substrate 304, the gate insulating layer 310 and the scanning lines 311 are disposed between the data lines 302 and the glass substrate 304. The compensation signal lines 312 and the power supply signal lines 303 are arranged at intervals on the surface of the glass substrate 304, and correspond to the data lines 302 respectively. The power supply signal lines 303 and the compensation signal lines 312 can be prepared on a same metal layer. Wherein the data lines 302 are prepared on a surface of the gate insulating layer 310, but in other embodiments, the data lines 302 can be prepared on other film layer in parallel with the glass substrate 304. The data lines 302 are prepared on a surface of the film layer along an extension direction of the film layer, and the power supply signal lines 303 and the compensation signal lines 312 are prepared along an extension direction of the array substrate. That is, the power supply signal lines 303, the compensation signal lines 312, and the data lines 302 have the same extension direction.

The conduction method between the power supply signal lines 303, the compensation signal lines 312, and both sides of the glass substrate 304 are the same as embodiment 1, that is achieved by the through-hole and the bonding area. In the same way, the through-hole and the bonding area can also connect and conduct the array substrate and the control chip.

FIG. 3C is a pixel equivalent circuit diagram of an array substrate according to embodiment 2 of the present disclosure. One sub-pixel of the array substrate comprises a first thin film transistor T1, a second thin film transistor T2, a third thin film transistor T3, scanning lines Gate, cathode signal lines VSS, the data lines Data, the power supply signal lines VDD, the compensation signal lines Vc, and a storage capacitor Clc; an adjacent sub-pixel thereof comprises a fourth thin film transistor T4, a fifth thin film transistor T5, a sixth thin film transistor T6, the scanning lines Gate, the cathode signal lines VSS, the data lines Data, the power supply signal lines VDD, the compensation signal lines Vc, and the storage capacitor Clc. Wherein a gate electrode of the first thin film transistor T1 is electrically connected to the scanning lines Gate, and a source electrode of the first thin film transistor T1 is electrically connected to an N-th level data line Data(n); wherein a gate electrode of the second thin film transistor T2 is electrically connected to a drain electrode of the first thin film transistor T1, a source electrode of the second thin film transistor is electrically connected to an N-th level power supply signal line VDD VDD(n), and a drain electrode of the second thin film transistor T2 is electrically connected to an anode of an OLED; a cathode of the OLED is electrically connected to the cathode signal lines VSS; a gate electrode of the third thin film transistor T3 is electrically connected to the scanning lines Gate, a source electrode of the third thin film transistor T3 is electrically connected to the compensation signal lines Vc, and a drain electrode of the third thin film transistor T3 is electrically connected to the drain electrode of the second thin film transistor T2; a gate electrode of the fourth thin film transistor T4 is electrically connected to the scanning lines Gate, and a source electrode of the fourth thin film transistor is electrically connected to an (N+1)-th level data line Data(n+1); a gate electrode of the fifth thin film transistor T5 is electrically connected to a drain electrode of the fourth thin film transistor T4, a source electrode of the fifth thin film transistor T5 is electrically connected to an (N+1)-th level power supply signal line VDD(n+1), and a drain electrode of the fifth thin film transistor T5 is electrically connected to the anode of the OLED; a gate electrode of the sixth thin film transistor T6 is electrically connected to the scanning lines Gate, a source electrode of the sixth thin film transistor T6 is electrically connected to the compensation signal lines Vc, and a drain electrode of the sixth thin film transistor is electrically connected to the drain electrode of the fifth thin film transistor T5; the storage capacitor Clc is electrically connected to the gate electrode and the drain electrode of the second thin film transistor T2, or is electrically connected to the gate electrode and the drain electrode of the fifth thin film transistor T5; the two adjacent sub-pixels share one of the compensation signal lines Vc.

The pixel structure 3T1C is used in the embodiment. Compared to embodiment 1, a compensation signal line Vc is added in embodiment 2. The pixel in the embodiment comprises three thin film transistors, a storage capacitor, and OLED devices. The compensation signal line Vc is connected to the anode of the OLED through a thin film transistor.

Embodiment 2 of the present disclosure is to dispose the data lines 302, the power supply signal lines 303, and the compensation signal lines 312 respectively on both sides of the glass substrate 304. Wherein the power supply signal lines 303 and the compensation signal lines 312 are located on a same side surface of the glass substrate 304, and the data lines 302 are prepared on a surface of the gate insulating layer 310. In other embodiments, the data lines 302, the power supply signal lines 303, and the compensation signal lines 312 can be prepared on surfaces of any two different film layers, as long as the data lines 302 and the power supply signal lines 303 have a same extension direction, and the data lines 302 and the compensation signal lines 312 have a same extension direction. In addition, the data lines 302 and the power supply signal lines 303 at least partially overlap in the pixel structure, the data lines 302 and the compensation signal lines 312 at least partially overlap in the pixel structure, and the power supply signal lines 303 and the compensation signal lines 312 are alternatively arranged in a same film layer surface.

Embodiment 2 of the present disclosure is based on embodiment 1, it reduces areas between the compensation signal lines 312 and the data lines 302 by making the data lines 302 and the power supply signal lines 303, the data lines 302 and the compensation signal lines 312 at least partially overlap to improve aperture ratio of the pixels.

The working principle of the OLED display device of the embodiment is the same as that of the array substrate of the above embodiment. For details, it can be referred to the working principle of the array substrate in the above embodiment.

The beneficial effect of the present disclosure is that: compared to current array substrates and OLED display devices, the array substrate and OLED display device provided in the present disclosure solve the technical problem of dense vertical lines in current array substrates that causes a lower pixel aperture ratio, thereby affecting brightness and power consumption of display devices. The technical problem is solved by preparing data lines and power supply signal lines respectively on different film layer surfaces in the vertical direction, and the data lines and the power supply signal lines at least partially overlap that makes each column of sub-pixels correspond to one of the data lines and one of the power supply signal lines. In this way, area occupied by circuit lines in the vertical direction of pixels is become less, thereby improving aperture ratio of pixels.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:
1. An array substrate, comprising:
  a plurality of sub-pixels distributed in an array arrangement, wherein data lines and power supply signal lines are disposed between two adjacent columns of the sub-pixels; and
  compensation signal lines disposed in parallel with the power supply signal lines;
  wherein the data lines and the power supply signal lines are on different film layer surfaces, and the data lines and the power supply signal lines at least partially overlap; and
  the data lines are disposed on the array substrate, the power supply signal lines are on a back side of the array substrate and disposed opposite to the data lines, a signal input terminal of the power supply signal lines extends to a bonding area and is electrically connected to a control chip by a through-hole disposed on the array substrate.

2. The array substrate according to claim 1, wherein the data lines and the power supply signal lines have a same extension direction.

3. The array substrate according to claim 2, wherein each sub-pixel of the array substrate comprises a first thin film transistor, a second thin film transistor, scanning lines, cathode signal lines, the data lines, the power supply signal lines, and a storage capacitor;
wherein a gate electrode of the first thin film transistor is electrically connected to the scanning lines, and a source electrode of the first thin film transistor is electrically connected to the data lines;
a gate electrode of the second thin film transistor is electrically connected to a drain electrode of the first thin film transistor, a source electrode of the second thin film transistor is electrically connected to the power supply signal lines, and a drain electrode of the second thin film transistor is electrically connected to an anode of an organic light-emitting diode (OLED);
a cathode of the OLED is electrically connected to the cathode signal lines; and
the storage capacitor is electrically connected to the gate electrode and the drain electrode of the second thin film transistor.

4. The array substrate according to claim 3, wherein each column of the sub-pixels corresponds to one of the data lines and one of the power supply signal lines.

5. The array substrate according to claim 1, wherein the compensation signal lines and the data lines at least partially overlap, and the compensation signal lines and the data lines have a same extension direction.

6. The array substrate according to claim 5, wherein the compensation signal lines are on a back side of the array substrate and are alternatively disposed with the power supply signal lines.

7. The array substrate according to claim 6, wherein one sub-pixel of the array substrate comprises a first thin film transistor, a second thin film transistor, a third thin film transistor, scanning lines, cathode signal lines, the data lines, the power supply signal lines, the compensation signal lines, and a storage capacitor; an adjacent sub-pixel comprises a fourth thin film transistor, a fifth thin film transistor, a sixth thin film transistor, the scanning lines, the cathode signal lines, the data lines, the power supply signal lines, the compensation signal lines, and the storage capacitor;
wherein a gate electrode of the first thin film transistor is electrically connected to the scanning lines, and a source electrode of the first thin film transistor is electrically connected to an N-th level data line;
wherein a gate electrode of the second thin film transistor is electrically connected to a drain electrode of the first thin film transistor, a source electrode of the second thin film transistor is electrically connected to an N-th level power supply signal line, and a drain electrode of the second thin film transistor is electrically connected to an anode of an organic light-emitting diode (OLED);
a cathode of the OLED is electrically connected to the cathode signal lines;
a gate electrode of the third thin film transistor is electrically connected to the scanning lines, a source electrode of the third thin film transistor is electrically connected to the compensation signal lines, and a drain electrode of the third thin film transistor is electrically connected to the drain electrode of the second thin film transistor;
a gate electrode of the fourth thin film transistor is electrically connected to the scanning lines, and a source electrode of the fourth thin film transistor is electrically connected to an (N+1)-th level data line;
a gate electrode of the fifth thin film transistor is electrically connected to a drain electrode of the fourth thin film transistor, a source electrode of the fifth thin film transistor is electrically connected to an (N+1)-th level power supply signal line, and a drain electrode of the fifth thin film transistor is electrically connected to the anode of the OLED;
a gate electrode of the sixth thin film transistor is electrically connected to the scanning lines, a source electrode of the sixth thin film transistor is electrically connected to the compensation signal lines, and a drain electrode of the sixth thin film transistor is electrically connected to the drain electrode of the fifth thin film transistor;
the storage capacitor is electrically connected to the gate electrode and the drain electrode of the second thin film transistor, or is electrically connected to the gate electrode and the drain electrode of the fifth thin film transistor; and
the two adjacent sub-pixels share one of the compensation signal lines.

8. The array substrate according to claim 7, wherein each column of the sub-pixels corresponds to one of the data lines, and every two columns of the sub-pixels correspond to one of the power supply signal lines or the compensation signal lines.

9. An array substrate, comprising:
a plurality of sub-pixels distributed in an array arrangement, wherein data lines and power supply signal lines are disposed between two adjacent columns of the sub-pixels; and
compensation signal lines disposed in parallel with the power supply signal lines, wherein the compensation signal lines and the data lines at least partially overlap, and the compensation signal lines and the data lines have a same extension direction;
wherein the data lines and the power supply signal lines are on different film layer surfaces, and the data lines and the power supply signal lines at least partially overlap.

10. The array substrate according to claim 9, wherein the data lines are disposed on the array substrate, the power supply signal lines are on a back side of the array substrate and disposed opposite to the data lines, a signal input terminal of the power supply signal lines extends to a bonding area and is electrically connected to a control chip by a through-hole disposed on the array substrate.

11. The array substrate according to claim 10, wherein the data lines and the power supply signal lines have a same extension direction.

12. The array substrate according to claim 11, wherein each sub-pixel of the array substrate comprises a first thin film transistor, a second thin film transistor, scanning lines, cathode signal lines, the data lines, the power supply signal lines, and a storage capacitor;
wherein a gate electrode of the first thin film transistor is electrically connected to the scanning lines, and a source electrode of the first thin film transistor is electrically connected to the data lines;
wherein a gate electrode of the second thin film transistor is electrically connected to a drain electrode, a source electrode of the second thin film transistor is electrically connected to the power supply signal lines, and a drain electrode of the second thin film transistor is electrically connected to an anode of an organic light-emitting diode (OLED);

a cathode of the OLED is electrically connected to the cathode signal lines; and The storage capacitor is electrically connected to the gate electrode and the drain electrode of the second thin film transistor.

13. The array substrate according to claim 12, wherein each column of the sub-pixels corresponds to one of the data lines and one of the power supply signal lines.

14. The array substrate according to claim 9, wherein the compensation signal lines are on a back side of the array substrate and are alternatively disposed with the power supply signal lines.

15. The array substrate according to claim 14, wherein one sub-pixel of the array substrate comprises a first thin film transistor, a second thin film transistor, a third thin film transistor, scanning lines, cathode signal lines, the data lines, the power supply signal lines, the compensation signal lines, and a storage capacitor; an adjacent sub-pixel comprises a fourth thin film transistor, a fifth thin film transistor, a sixth thin film transistor, the scanning lines, the cathode signal lines, the data lines, the power supply signal lines, the compensation signal lines, and the storage capacitor;

wherein a gate electrode of the first thin film transistor is electrically connected to the scanning lines, and a source electrode of the first thin film transistor is electrically connected to an N-th level data line;

wherein a gate electrode of the first thin film transistor is electrically connected to the scanning lines, and a source electrode of the first thin film transistor is electrically connected to an N-th level data line;

wherein a gate electrode of the second thin film transistor is electrically connected to a drain electrode, a source electrode of the second thin film transistor is electrically connected to an N-th level power supply signal line, and a drain electrode of the second thin film transistor is electrically connected to an anode of an OLED;

a cathode of the OLED is electrically connected to the cathode signal lines;

a gate electrode of the third thin film transistor is electrically connected to the scanning lines, a source electrode of the third thin film transistor is electrically connected to the compensation signal lines, and a drain electrode of the third thin film transistor is electrically connected to the drain electrode of the second thin film transistor;

a gate electrode of the fourth thin film transistor is electrically connected to the scanning lines, and a source electrode of the fourth thin film transistor is electrically connected to an (N+1)-th level data line;

a gate electrode of the fifth thin film transistor is electrically connected to a drain electrode of the fourth thin film transistor, a source electrode of the fifth thin film transistor is electrically connected to an (N+1)-th level power supply signal line, and a drain electrode of the fifth thin film transistor is electrically connected to the anode of the OLED;

a gate electrode of the sixth thin film transistor is electrically connected to the scanning lines, a source electrode of the sixth thin film transistor is electrically connected to the compensation signal lines, and a drain electrode of the sixth thin film transistor is electrically connected to the drain electrode of the fifth thin film transistor;

the storage capacitor is electrically connected to the gate electrode and the drain electrode of the second thin film transistor, or is electrically connected to the gate electrode and the drain electrode of the fifth thin film transistor; and the two adjacent sub-pixels share one of the compensation signal lines.

16. The array substrate according to claim 15, wherein each column of the sub-pixels corresponds to one of the data lines, and every two columns of the sub-pixels correspond to one of the power supply signal lines or the compensation signal lines.

17. An organic light-emitting diode (OLED) display device, comprising an array substrate, wherein the array substrate comprises a plurality of sub-pixels distributed in an array arrangement, and a plurality of data lines and a plurality of power supply signal lines are disposed between two adjacent columns of the sub-pixels;

the data lines and the power supply signal lines are on different film layer surfaces, and the data lines and the power supply signal lines at least partially overlap; and the data lines are disposed on the array substrate, the power supply signal lines are on a back side of the array substrate and disposed opposite to the data lines, a signal input terminal of the power supply signal lines extends to a bonding area and is electrically connected to a control chip by a through-hole disposed on the array substrate.

18. The OLED display device according to claim 17, wherein the data lines and the power supply signal lines have a same extension direction.

* * * * *